(12) United States Patent
Li et al.

(10) Patent No.: US 8,220,528 B2
(45) Date of Patent: Jul. 17, 2012

(54) HEAT DISSIPATION DEVICE

(75) Inventors: Wei Li, Shenzhen (CN); Yi-Qiang Wu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 715 days.

(21) Appl. No.: 12/396,480

(22) Filed: Mar. 3, 2009

(65) Prior Publication Data
US 2010/0038057 A1 Feb. 18, 2010

(30) Foreign Application Priority Data
Aug. 13, 2008 (CN) .......................... 2008 1 0303752

(51) Int. Cl.
*H05K 7/20* (2006.01)
(52) U.S. Cl. .................. 165/80.3; 165/104.33; 361/700
(58) Field of Classification Search ................. 165/80.3, 165/104.33, 185; 361/700, 704, 710
See application file for complete search history.

(56) References Cited

U.S. PATENT DOCUMENTS

| 6,625,021 | B1 * | 9/2003 | Lofland et al. | 361/697 |
| 6,785,140 | B2 * | 8/2004 | Artman et al. | 361/709 |
| 6,880,621 | B2 * | 4/2005 | Wang | 165/80.3 |
| 7,121,327 | B2 * | 10/2006 | Chen | 165/104.34 |
| 7,215,548 | B1 * | 5/2007 | Wu et al. | 361/703 |
| 7,661,466 | B2 * | 2/2010 | Li et al. | 165/104.33 |
| 2003/0218849 | A1 * | 11/2003 | Mochizuki et al. | 361/103 |
| 2005/0115702 | A1 * | 6/2005 | Lin et al. | 165/185 |
| 2006/0272799 | A1 * | 12/2006 | Hsu et al. | 165/104.33 |

* cited by examiner

*Primary Examiner* — Allen Flanigan
(74) *Attorney, Agent, or Firm* — Altis Law Group, Inc.

(57) ABSTRACT

A heat dissipation device for cooling an electronic device mounted on a printed circuited board, comprises a heat spreader contacting the electronic device, a fin assembly comprising a plurality of fins, a supporting bracket contacting the heat spreader and supporting the fin assembly, and a heat pipe extending through the fin assembly and the supporting bracket and attached to the heat spreader, wherein a lowermost fin of the fin assembly has a plurality of clasps extending near two opposite ends thereof and towards the supporting bracket. The clasps are bent to press against a bottom of the supporting bracket after the clasps extend through the supporting bracket.

15 Claims, 4 Drawing Sheets

HEAT DISSIPATION DEVICE

BACKGROUND OF THE INVENTION

1. Field of the Invention

The disclosure relates to heat dissipation devices, and more particularly to a heat dissipation device which has a strengthened structure.

2. Description of Related Art

Nowadays, numerous heat dissipation devices are used to dissipate heat generated by electronic devices. A tower type heat dissipation device is a common structure of the heat dissipation devices. Conventionally, the heat dissipation device comprises a heat spreader thermally contacting with an electronic device, a fin assembly, a supporting bracket located on the heat spreader and contacting with the fin assembly, and a heat pipe extending through the fin assembly and the supporting bracket and connecting the heat spreader. The heat pipe, the fin assembly and the supporting bracket are soldered together in a manner such that the supporting bracket supports the fin assembly thereon. However, since the fin assembly comprises so many fins stacked together, the tower type heat dissipation device is relatively heavy, whereby the fin assembly is prone to disengage from the supporting bracket when subjected to shock or vibration during transportation or use.

What is needed, therefore, is a heat dissipation device which can overcome the limitation described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
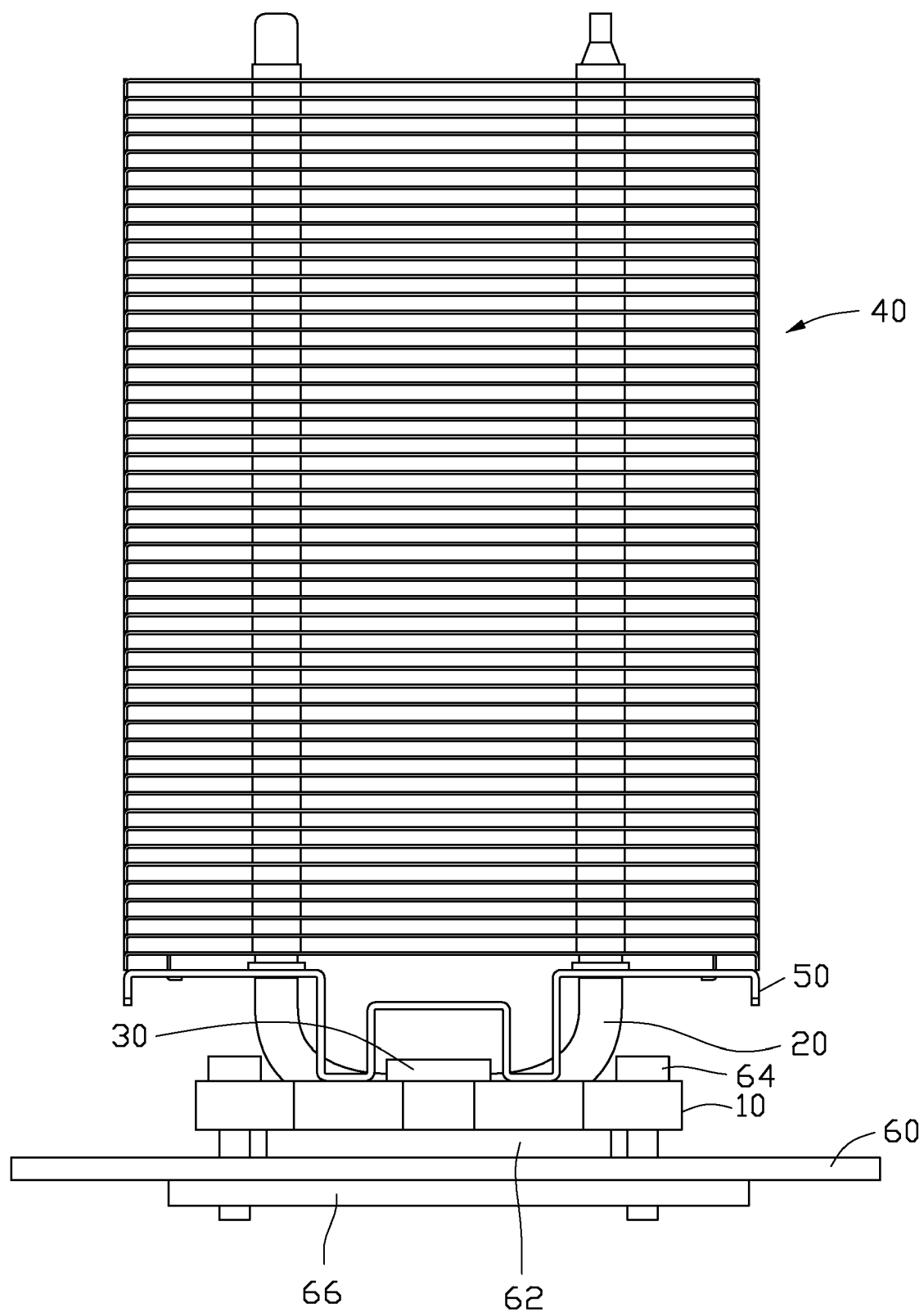
FIG. 1 is a front elevational view of a heat dissipation device in accordance with one embodiment of the disclosure.

FIG. 1 shows a heat dissipation device in accordance with an embodiment of the disclosure. The heat dissipation device is mounted on a printed circuit board 60 for dissipating heat generated by an electronic device 62 attached on the printed circuit board 60.

The heat dissipation device comprises a heat spreader 10 contacting with the electronic device 62, a heat pipe 20 thermally contacting with the heat spreader 10, a fixing plate 30 fixing the heat pipe 20 on the heat spreader 10, a fin assembly 40 and a supporting bracket 50 supporting the fin assembly 40.

Figure 2:
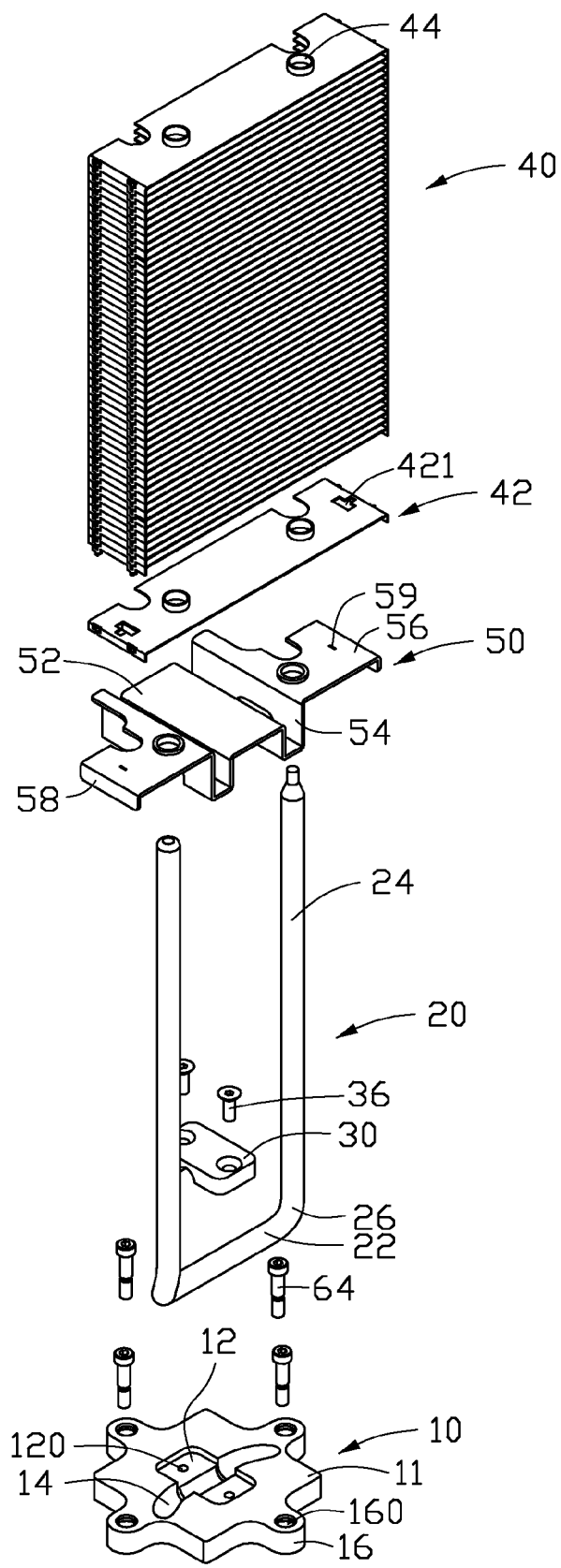
FIG. 2 is an isometric, exploded view of the heat dissipation device of FIG. 1.
Figure 3:
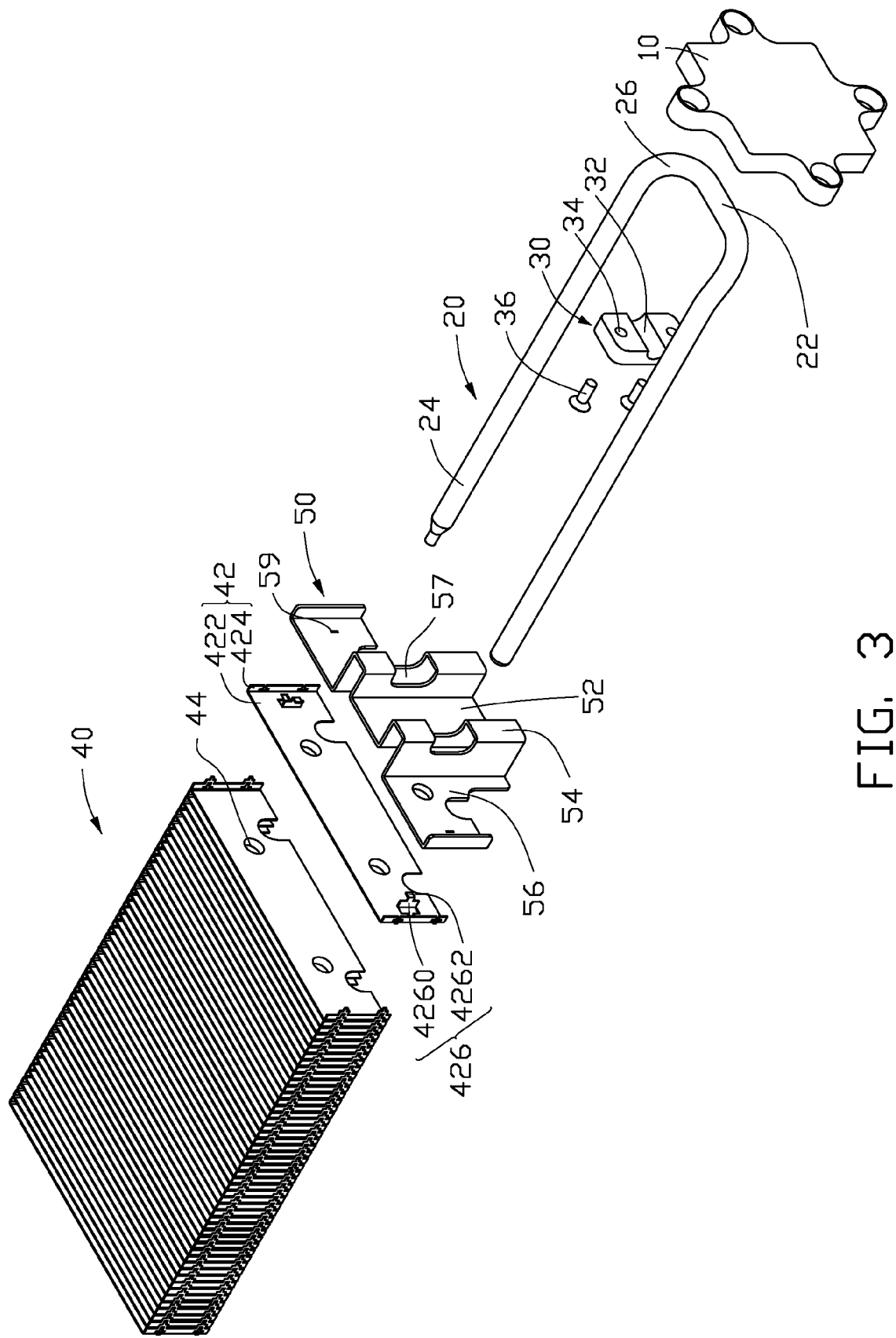
FIG. 3 is another isometric, exploded view of the heat dissipation device of FIG. 1.

Also referring to FIGS. 2-3, the heat spreader 10 is made of metal such as aluminum, copper or an alloy thereof. The heat spreader 10 is for absorbing heat from the electronic device 62 mounted on the printed circuit board 60. The heat spreader 10 includes a rectangular body 11 and four ears 16 each extending horizontally from a center of a sidewall of the body 11. A rectangular groove 12 is defined in a center of a top of the body 11. An arced slot 14 is defined in the center of the top of the body 11 and intersects with the groove 12. The slot 14 is deeper than the groove 12. The four ears 16 each define a through hole 160. Four corresponding fasteners 64 extend through the through holes 160 of the four ears 16 of the heat spreader 10 and the printed circuit board 60 and engage with a back plate 66 below the printed circuit board 60 to mount the heat dissipation device onto the printed circuit board 60. The heat spreader 10 defines two threaded holes 120 below and communicating with the groove 12.

The heat pipe 20 has a U-shaped configuration and comprises two vertical sections functioning as condensing sections 24, a horizontal section functioning as an evaporating section 22 and two arced connecting sections interconnecting the two condensing sections 24 and the evaporating section 22 and employed as adiabatic sections 26. The two adiabatic sections 26 are curved beyond a plane defined by the two condensing sections 24 so that the evaporating section 22 is not coplanar with the two condensing sections 24. The evaporating section 22 of the heat pipe 20 is accommodated and soldered in the slot 14 of the heat spreader 10. The two condensing sections 24 of the heat pipe 20 extend through the fin assembly 40 and the supporting bracket 50.

The fixing plate 30 defines a channel 32 corresponding to the slot 14 of the heat spreader 10 for receiving the evaporating section 22 of the heat pipe 20 therein. Two opposite ends of the fixing plate 30 each define a through hole 34. A lower portion of the fixing plate 30 is received in the groove 12 of the heat spreader 10. A pair of screws 36 extends through the through holes 34 of the fixing plate 30 and threadedly engages in the threaded holes 120 of the heat spreader 10 for fixing the heat pipe 20 onto the heat spreader 10.

The fin assembly 40 comprises a plurality of spaced and parallel fins 42. The fins 42 each are made of metal such as aluminum, copper or an alloy thereof and have a flat main body 422 and a pair of flanges 424 extending perpendicularly from two opposite ends of the main body 422. The pair of flanges 424 extends downwardly from the two opposite ends of the flat main body 422 towards the supporting bracket 50. The pair of flanges 424 of each fin 42 extends along the same direction and abuts against the flat main body 422 of an adjacent lower fin 42. The flanges 424 of the fins 42 form two planes at two lateral sides of the fin assembly 40. Two neighboring ones of the fins 42 of the fin assembly 40 are spaced from each other with a uniform interval. All the flanges 424 of the fins 42, except a lowermost fin 42, form buckles (not labeled) projecting downwardly from the flanges 424. By the buckles, the fins 42 are connected together. The lowermost fin 42 of the fin assembly 40 has two clasps 426 punched near the two opposite ends of the main body 422 thereof. The two clasps 426 extend downwardly towards the supporting bracket 50. Two corresponding punching holes 421 are formed in the main body 422 of the lowermost fin 42 after the two clasps 426 are punched. The two clasps 426 each include a rectangular body 4260 perpendicular to the main body 422 and a hook 4262 extending inwardly from a center of a distal end of the body 4260 along a horizontal orientation parallel to the main body 422. The hook 4262 is bent from an originally formed vertical orientation to the horizontal orientation of FIG. 3 in order to lock with the supporting bracket 50. Each fin 42 of the fin assembly 40 and the supporting bracket 50 are perforated with two through holes 44. The condensing sections 24 of the heat pipe 20 extend through and are received in the through holes 44 of the fins 42 of the fin assembly 40 and the supporting bracket 50.

The supporting bracket 50 is made of metal such as aluminum, copper or an alloy thereof. The supporting bracket 50 is located below the fin assembly 40 and contacts with the heat spreader 10. The supporting bracket 50, the fin assembly 40 and the heat spreader 10 are soldered together. The supporting bracket 50 has a thickness larger than that of each fin 42 of the fin assembly 40. The supporting bracket 50 is for supporting the fin assembly 40 and reinforcing the whole strength of the fin assembly 40, in addition to its original function of heat dissipation. The supporting bracket 50 includes a connecting portion 52 located at a middle thereof, two U-shaped supporting portions 54 integrally formed at two ends of the connecting portion 52, two arms 56 respectively extending outwardly from two free ends of the two supporting portions 54 and two flanges 58 extending vertically and downwardly from two distal ends of the two arms 56. The two supporting portions 54 each have a bottom surface contacting with a top surface of the heat spreader 10 and define a recess 57 in a bottom thereof for receiving the adiabatic section 26 of the heat pipe 20. The recess 57 penetrates through the supporting portion 54 of the supporting bracket 50. The two arms 56 of the supporting bracket 50 define two clasp holes 59 near two ends thereof for extension of the two clasps 426 of the lowermost fin 42 of the fin assembly 40 therethrough. The two hooks 4262 of the two clasps 426 are able to be bent from the vertical orientation to the horizontal orientation to thereby press tightly against a bottom surface of the supporting bracket 50, after the two hooks 4262 of the two clasps 426 extend downwardly through the two clasp holes 59 of the supporting bracket 50. Thus, the lowermost fin 42 and the supporting bracket 50 can be securely connected together.

In assembly, the evaporating section 22 of the heat pipe 20 is received and soldered in the slot 14 of the heat spreader 10. The fixing plate 30 is received in the groove 12 of the heat spreader 10 to thereby fix the heat pipe 20 on the heat spreader 10. The two hooks 4262 of the two clasps 426 of the lowermost fin 42 extend downwardly through the two clasp holes 59 of the supporting bracket 50. Then the two hooks 4262 of the two clasps 426 are bent to press against the bottom surface of the supporting bracket 50 to thereby securely connect the fin assembly 40 and the supporting bracket 50 together. The condensing sections 24 of the heat pipe 20 are brought to extend through the supporting bracket 50 and the fin assembly 40 till the supporting portions 54 of the supporting bracket 50 abut against the heat spreader 10. Thus, the heat dissipation device is assembled together.

According to the previous disclosure, in addition to be soldered to the supporting bracket 50, the lowermost fin 42 is further locked with the supporting bracket 50 via the clasps 426 thereof, thus, the fin assembly 40 can maintain its reliable attachment on the supporting bracket 50 without disengagement, even when the fin assembly 40 is subjected to vibration or shock.

Figure 4:
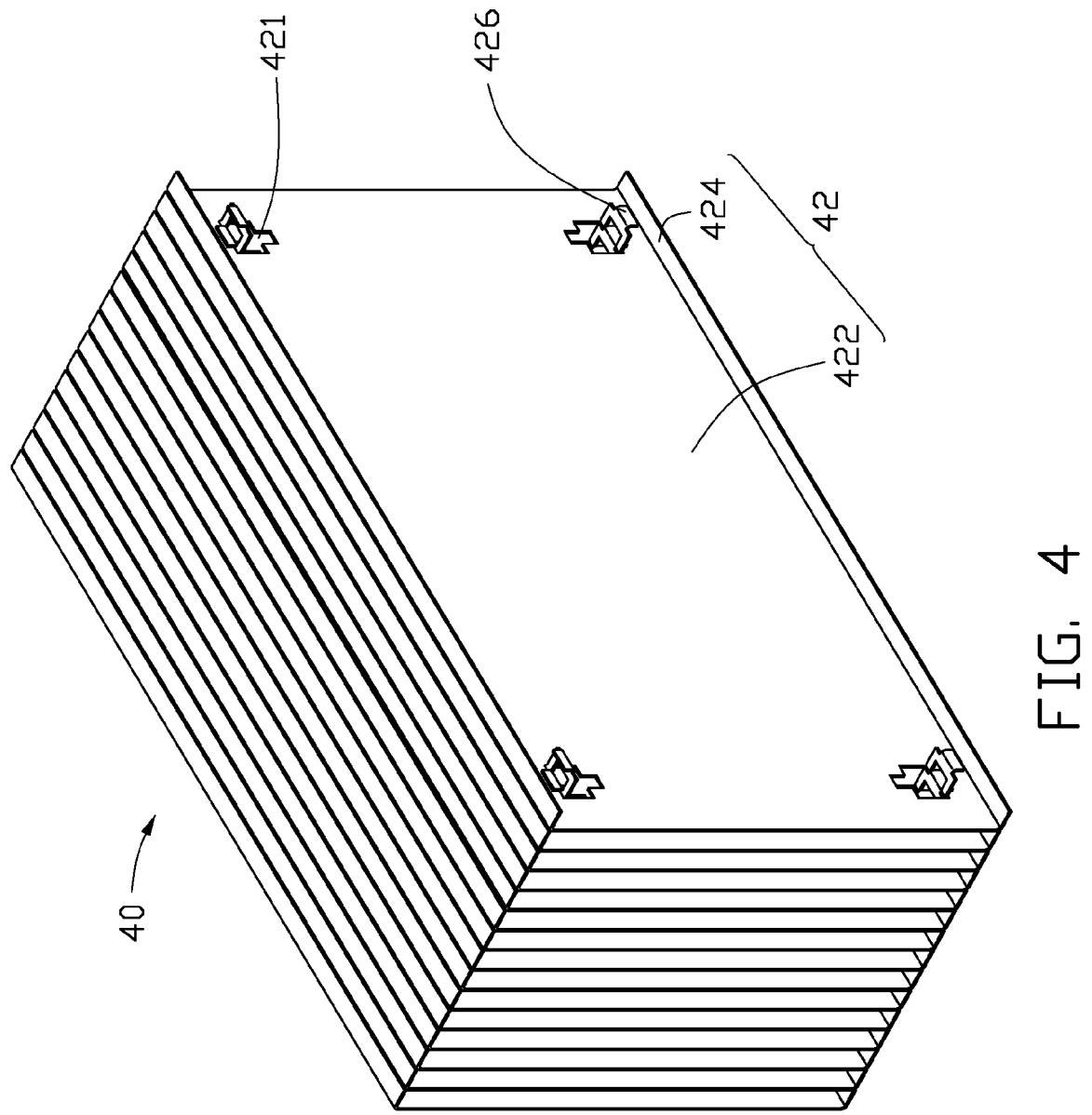
FIG. 4 is an isometric, assembled view of a fin assembly of a heat dissipation device in accordance with another embodiment of the disclosure.

For preventing an operator from injury by the buckles when carelessly touching the lateral sides of the fin assembly 40, it can be understood that the buckles formed on the two opposite sides of each fin 42 can be replaced by the structures shown in FIG. 4, in which the main body 422 of the each fin 42 is punched to form four punching holes 421 and four corresponding clasps 426 each having an opening (not labeled) defined therein. The clasp 426 of each fin 42 is bended outwardly into the opening of the clasp 426 of an adjacent fin 42 to press against the main body 422 of the adjacent fin 42, thereby interlocking the fins 42 together.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for cooling an electronic device mounted on a printed circuited board, comprising:
    a heat spreader contacting the electronic device;
    a fin assembly comprising a plurality of fins;
    a supporting bracket contacting the heat spreader and supporting the fin assembly; and
    a heat pipe extending through the fin assembly and the supporting bracket, and attached to the heat spreader, wherein a lowermost fin of the fin assembly has a plurality of clasps extending towards the supporting bracket, the clasps being bent and pressing a bottom of the supporting bracket after the clasps extending through the supporting bracket;
    wherein each of the clasps comprises a body and a hook extending from a distal end of the body, the supporting bracket defining a plurality of clasp holes near two ends thereof, the hooks of the clasps being bent and pressing a bottom of the supporting bracket after the hooks of the clasps extending through the clasp holes of the supporting bracket;
    wherein each of the fins includes a main body and two flanges extending at two opposite ends of the main body and towards the supporting bracket, the clasps being formed at the main body and near the two flanges; and
    wherein the supporting bracket includes a connecting portion located at a middle thereof, two supporting portions integrally formed at two opposite ends of the connecting portion, two arms respectively extending outwardly from two free ends of the two supporting portions and two flanges extending downwardly from two distal ends of the arms.

2. The heat dissipation device as claimed in claim 1, wherein the clasps are formed near two opposite ends of each fin of the fin assembly, a plurality of corresponding punching holes being formed near the two opposite ends of each fin corresponding to the clasps, the clasps of each fin extending through the punching holes of an adjacent fin for connecting the fins together.

3. The heat dissipation device as claimed in claim 1, wherein the two flanges of each of the fins abut against the main body of an adjacent fin.

4. The heat dissipation device as claimed in claim 1, wherein the two flanges of each of the fins extend along the same direction.

5. The heat dissipation device as claimed in claim 1, wherein the flanges of the fins form two planes at two lateral sides of the fin assembly.

6. The heat dissipation device as claimed in claim 1, wherein each of the two supporting portions is U-shaped and has a bottom surface contacting with a top surface of the heat spreader.

7. The heat dissipation device as claimed in claim 6, wherein the heat pipe has a U-shaped configuration and comprises two condensing sections, an evaporating section and two adiabatic sections interconnecting the two condensing sections and the evaporating section, the two adiabatic sections being curved beyond a plane defined by the two condensing sections, and the evaporating section being not coplanar with the two condensing sections.

8. The heat dissipation device as claimed in claim 7, wherein the heat spreader defines a slot, the evaporating section of the heat pipe being inserted into the slot of the heat spreader.

9. The heat dissipation device as claimed in claim 8, wherein the fins of the fin assembly and the supporting bracket each define two through holes, the two supporting portions of the supporting bracket each define a recess, the two condensing sections of the heat pipe extending through the two through holes, the two adiabatic sections of the heat pipe being received in the recesses of the two supporting portions of the supporting bracket.

10. The heat dissipation device as claimed in claim 9, further comprising a fixing plate attached to the heat spreader and fixing the heat pipe on the heat spreader.

11. The heat dissipation device as claimed in claim 1, wherein the supporting bracket has a thickness larger than that of each of the fins of the fin assembly.

12. A heat dissipation device comprising:
a heat spreader;
a fin assembly comprising a plurality of fins;
a supporting bracket thermally contacting with the heat spreader and located below the fin assembly; and
a heat pipe extending through the fin assembly and the supporting bracket and attached to the heat spreader, wherein a lowermost fin of the fin assembly has a plurality of clasps formed thereon, the lowermost fin connecting the supporting bracket via the plurality of clasps deformed to engage with the supporting bracket;
wherein the supporting bracket includes a connecting portion located at a middle thereof, two U-shaped supporting portions integrally formed at two opposite ends of the connecting portion, two arms respectively extending outwardly from two free ends of the two supporting portions and two flanges extending downwardly from two distal ends of the arms.

13. The heat dissipation device as claimed in claim 12, wherein the plurality of clasps are formed near two opposite ends of the lowermost fin and towards the supporting bracket, each clasp including a body and a hook extending from a distal end of the body, the supporting bracket defining a plurality of clasp holes near two opposite ends thereof, the hooks of the clasps being bent and pressing a bottom of the supporting bracket after the hooks of the clasps extending through the clasp holes of the supporting bracket.

14. The heat dissipation device as claimed in claim 12, wherein the hooks of the clasps are extended through the two arms of the supporting bracket.

15. The heat dissipation device as claimed in claim 13, wherein the heat pipe has a U-shaped configuration and comprises two condensing sections, an evaporating section and two adiabatic sections interconnecting the two condensing sections and the evaporating section, the U-shaped supporting portions of the supporting bracket each define a recess, the two adiabatic sections of the heat pipe being received in the recesses of the U-shaped supporting portions of the supporting bracket.

* * * * *